United States Patent [19]  
Witt

[11] Patent Number: 4,812,962  
[45] Date of Patent: Mar. 14, 1989

[54] AREA FEATURE SORTING MECHANISM FOR NEIGHBORHOOD-BASED PROXIMITY CORRECTION IN LITHOGRAPHY PROCESSING OF INTEGRATED CIRCUIT PATTERNS

[75] Inventor: Terence R. Witt, Indian Harbour Beach, Fla.

[73] Assignee: Harris Corp., Melbourne, Fla.

[21] Appl. No.: 36,508

[22] Filed: Apr. 9, 1987

[51] Int. Cl.⁴ .............................................. G03C 5/00
[52] U.S. Cl. .................................. 364/490; 364/488; 250/492.2; 430/296
[58] Field of Search ............... 364/488, 489, 490, 491; 250/492.2, 492.3, 398; 430/296

[56] References Cited

U.S. PATENT DOCUMENTS

| | | | |
|---|---|---|---|
| 4,426,584 | 1/1984 | Bohlen et al. | 430/296 |
| 4,463,265 | 7/1984 | Owen et al. | 250/398 |
| 4,504,558 | 3/1985 | Bohlen et al. | 250/492.2 |
| 4,520,269 | 5/1985 | Jones | 430/296 |
| 4,717,644 | 1/1988 | Jones et al. | 250/492.3 |

Primary Examiner—Parshotam S. Lall  
Assistant Examiner—V. N. Trans  
Attorney, Agent, or Firm—Antonell, Terry & Wands

[57] ABSTRACT

Proximity correction of an area feature in lithography processing of an integrated circuit device is facilitated by a procedure for locating those area features which lie within a prescribed proximity correction neighborhood of an area feature of interest. The method comprises examining the pattern, for each of a plurality of area windows associated with respective distance increments extending in a first direction across the pattern, to identify those area features which are located within a respective area window extending in a second direction from a respective distance increment, and storing information representative of characteristics of each identified area feature in a group that is associated with that respective area window. For each of the area features whose identities have been stored, a boundary window which delineates the prescribed proximity correction neighborhood relative to that respective area feature is defined. Then, for a respective area feature, those area features that have been stored and geometry data for which are contained within the boundary window for the respective area feature are selected as lying within the prescribed proximity correction neighborhood of the area feature of interest.

11 Claims, 4 Drawing Sheets

| | HEAP | MEMORY | |
|---|---|---|---|
| AW1 | AF1 | AF2 | |
| AW2 | AF3 | | |
| AW3 | AF4 | | |
| AW4 | AF5 | | |

AREA FEATURE SORTING MECHANISM FOR NEIGHBORHOOD-BASED PROXIMITY CORRECTION IN LITHOGRAPHY PROCESSING OF INTEGRATED CIRCUIT PATTERNS

FIELD OF THE INVENTION

The present invention relates in general to area feature sorting and is particularly directed to a mechanism for efficiently and rapidly identifying area features that satisfy a prescribed neighborhood proximity relationship for controlling the dosages through which respective area features of a surface area pattern of a semiconductor wafer are formed by lithography processing.

BACKGROUND OF THE INVENTION

Present day integrated circuit processing techniques often employ lithography processing, such as electron beam and X-ray lithography, to write ultra small geometry (submicron line widths) circuitry patterns onto a semiconductor wafer. When two written areas are close together, there may be a cross-dosing of the beam energy (e.g. electrons), causing an (undesirable) increase in size of the adjacent portions of the written areas. This unwanted exposure of a feature by one or more of its neighbors, termed the proximity effect, constitutes the fundamental limit to resolution in lithography processing. The dosage scattering typically extends over a range of several microns, so that virtually all significant wafer features are subject to the effect. Because, in most cases, the effect cannot be eliminated, compensation for scattering must be provided.

Compensation or correction of the proximity effect requires an alteration or modification of the beam dosage based upon area features within a prescribed neighborhood of a feature of interest. Whereas design-rule checking locates regions or features of a pattern that are too close to or not properly aligned with one another, proximity correction is a mechanism by which the pattern is actually corrected based upon a mathematical model of geometrical relationships and scatter. In order to generate the mathematical model it is necessary to locate neighboring features in what is a complex, often multi-element pattern. Computational speed is extremely critical due to the sizes of the data bases involved, and is often limited by the searching mechanism through which the element pattern is analyzed.

Conventional methods of neighbor identification are based upon logical bit-slice operations, where each pixel of a pattern image represents a single bit of data. There is an intrinsic difference, however, between integrated circuit pattern data upon which most design rule checking mechanisms operate and the integrated circuit data used by lithography equipment. The data used by electron beam lithography equipment, for example, is highly 'fractured', being broken into pieces small enough for the machine to physically write with an electron beam, which makes the database intractable by currently employed pattern processing techniques. Proximity checking is especially difficult on highly fractured data, since it is necessary to determine the proximity of all elements of the pattern with respect to each other and involves an extensive two-dimensional search.

SUMMARY OF THE INVENTION

In accordance with the present invention, the complexity and computational intensity of conventional pattern search mechanisms employed for lithography proximity correction, such as electron beam lithography, are obviated by a new and improved pattern analysis sorting mechanism through which proximal area features of a multi-element, two-dimensional array may be identified and located, so as to permit correction of the (electron beam) dosage for each area feature of an integrated circuit to be processed. Pursuant to the present invention a pattern of area features to be written onto a semiconductor wafer through lithography processing is analyzed by means of a two step windowing procedure which eliminates, as proximity correction neighbor candidates, those area features which fall outside a set of prescribed boundaries. The boundaries are established in accordance with the geometries of the area features, the maximum size of an individual area feature and a prescribed neighborhood separation distance that may impact the dosage characteristics of the area features of the resulting pattern. Given the location and size of each area feature within the pattern to be used in the lithography process, the proximity correction technique proceeds as follows.

First, for each of a plurality of successive distance increments extending in a first direction across the pattern (e.g. the horizontal or X-direction), the pattern is examined to identify those area features which are located within respective area windows extending in a second direction (e.g. the Y-direction) from respective associated distance increments. The identified area features are stored in groups or 'heaps', each of which is associated with a respective area window.

For each of the area features whose identities have been stored in the respective heaps, a boundary window is defined, the boundary window having a pair of parallel sides the separation between which encompasses the distance increment associated with the area window in which the respective area feature is located and extends respective predetermined distances to either side of the location of the respective area feature. To a first side of the location of the area feature of interest, the predetermined distance corresponds to the sum of the maximum possible dimension of the respective area feature in the first (e.g. horizontal or X-direction) direction and a prescribed neighborhood defining separation distance between adjacent area features. To a second side of the location of the area feature of interest, the distance corresponds to the sum of the actual dimension of area feature in the first direction and the prescribed neighborhood defining separation distance.

For each respective area feature that lies between the parallel sides of the boundary window, every remaining area feature that fails to satisfy a preselected neighborhood relationship with a second pair of parallel sides of the boundary window for the respective feature in a second direction is eliminated as a neighboring area feature to be used for proximity correction. Specifically, for any remaining area feature located on a first side of the location of the respective area feature of interest, the distance between the location of that remaining area feature and the location of the respective area feature in a second direction must be less than or equal to the sum of the dimension of the respective area feature in the second direction and the prescribed neighborhood defining separation distance between adjacent area features. Also, for any remaining area feature located on a second side of the location of the respective area feature of interest, the distance between its location and the location of the respective area feature in the second direction must be less than or equal to the sum of the maximum dimension of an area feature in the second direction and the prescribed neighborhood defining separation distance between adjacent area features.

In effect, such a boundary window procedure eliminates the need to process data for all of the area features of the pattern (namely, for a respective area feature of interest, only those area features that are capable of creating a cross-dosing problem are considered) and thereby considerably simplifies the identification of which area features are to be employed in correcting the beam dosage.

DETAILED DESCRIPTION

Figures 1, 2:
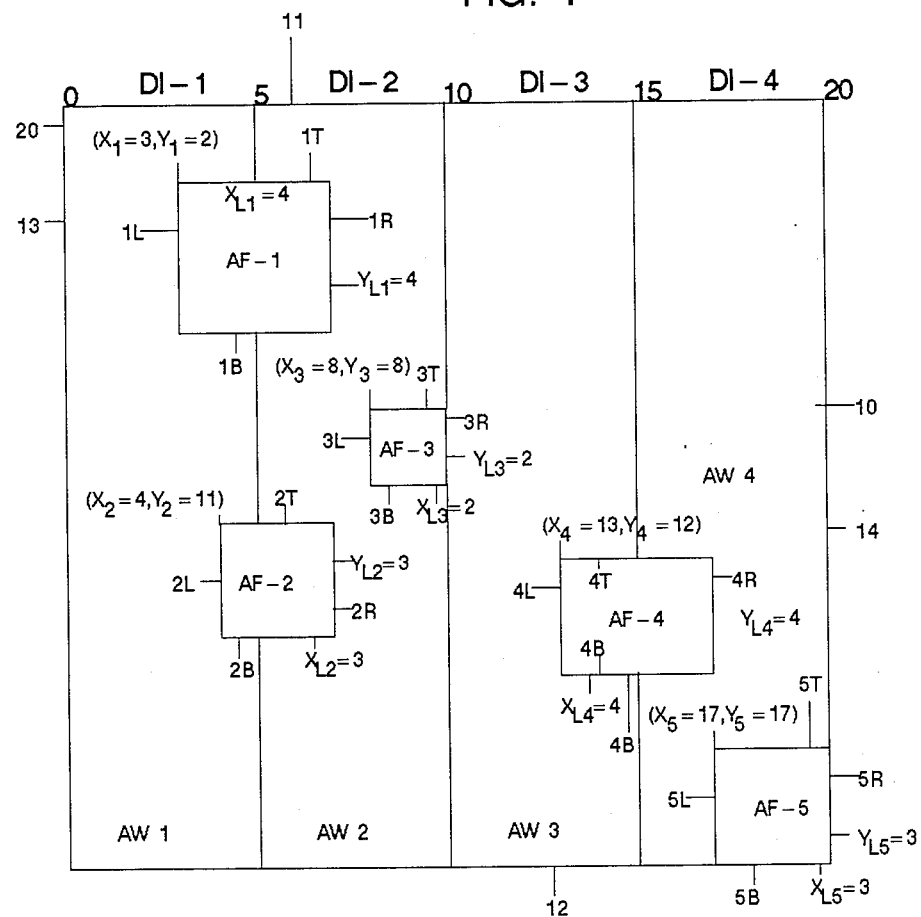
FIG. 1 is a diagrammatic illustration of a two-dimensional pattern of area features.
FIG. 2 is a diagrammatic illustration of the contents of a heap memory containing geometrical characteristic data for the area features of the pattern of FIG. 1.

Referring now to FIG. 1, there is shown a diagrammatic illustration of a two-dimensional pattern of area features representing an electron beam writing control map for controlling lithography processing (electron beam or X-ray processing) of a semiconductor wafer. In order to facilitate the present description and to simplify the drawings, the two-dimensional pattern 10 of area features shown in FIG. 1 is illustrated as being comprised of five randomly distributed rectangles AF1 ... AF5. It will be understood, of course, that a typical area feature pattern for lithography processing of a semiconductor wafer may comprise several million area features, which vary in size, shape and location. Thus, the parametric units employed in the present description are not to be considered limitative of the invention or equated with a specific area feature pattern to be employed for an actual lithography process, but are employed to facilitate an understanding of the improved area feature sorting methodology to which the present invention is directed.

As shown in FIG. 1, the two-dimensional pattern 10 has been illustrated as having a generally rectangular configuration, bounded by parallel sides or edges 11 and 12 which extend in a horizontal or X direction and by sides or edges 13 and 14 which extend in a vertical or Y direction, as viewed in the Figure. Pursuant to a first aspect of the present invention, the pattern 10 is subdivided into successive area windows AW1 ... AW4 which extend vertically or in the Y direction from successive distance increments along one (e.g. the top) edge or side 11 of the pattern 10. For this purpose, along the top edge 11 of the pattern 10 there are shown successive distance increments DI-1, DI-2, DI-3 and DI-4, each of which spans a distance of five units (the units being arbitrary) so that the width of the pattern 10 of the present example is twenty units from its left-hand edge 13 to its right-hand edge 14. Similarly, although not used in the same distance increment sense as are distance increments DI-1 ... DI-4, the pattern 10 of the present example is assumed to extend twenty distance units in the vertical direction between top edge 11 and bottom edge 12.

As pointed out above, distributed within the pattern 10 is some number of area features AF the sizes and locations of which will vary according to circuit design. Each area feature AFi is shown as being rectangular, in order to simplify the illustration, and is defined by the location of its upper left-hand corner relative to the intersection 20 of upper edge 11 and left-hand edge 13 of the pattern 10, as well as its length in the horizontal or X direction ($X_{Li}$) and its length in the vertical or Y direction ($Y_{Li}$). Although the location and size of each area feature may vary, it will be assumed, in accordance with conventional pattern geometry design practice, that each area feature does not exceed a given maximum area (in an actual integrated circuit design, the characteristics of a two-dimensional geometry are normally such that large area features are subdivided or 'fractured' into some number of smaller area features that do not exceed a given maximum size (maximum dimensions in the X and Y directions)). It is also to be understood that the format of the information representative of the two-dimensional pattern of area features is conventional and does not form a part of the present invention. For purposes of the present example, however, it will be assumed that the information is formatted so as to provide the above-referenced coordinates of the upper left-hand corner of the rectangle as well as the respective horizontal and vertical length dimensions ($X_{Li}$ and $Y_{Li}$) for each area feature.

Pursuant to a first aspect of the present invention, each of the area windows AW1 ... AW4 is examined for the presence of an area feature AFi. Thus, within area window AW1, which extends from left-hand edge 13 (X=0) of pattern 10 to a horizontal or X-distance up to but not touching the five unit distance (denoted by the value 4.99 ... ), two area features, specifically area feature AF1 and area feature AF2, are identified.

Area feature AFI has its upper left-hand corner, which represents its location within the pattern, represented by the coordinates (X1=3, Y1=2). Area feature AF1 is shown as being a square four units on each side, namely $X_{L1}=4$ and $Y_{L1}=4$. The respective sides of area feature AF1 are designated by the number of the area feature and a letter representative of the location of the side. Thus, for area feature AF1, the right-hand side is designated 1R, the bottom edge is designated 1B, the left-hand edge is designated 1L and the top edge is designated 1T. Similar alphanumerical designations are used for the remaining area features AF2 ... AF5 shown in FIG. 1.

As will be described below, the above-referenced geometrical characteristics of area feature AFI are stored within a 'heap' memory at a location associated with the area window (AW1) in which the area feature is located. In addition, as will be described below with reference to FIG. 3, boundary window information, representative of proximity correction neighborhood limits, is also stored in the heap memory. The boundary window limits depend upon the location and size of the area of feature of interest, as well as the maximum size of an area feature and the closest proximity separation permitted for adjacent area features.

Continuing down area window AW1 from the location of the first encountered area feature AF1, a second area feature AF2 is encountered at coordinate location ($X_2=4$, $Y_2=11$). In the exemplary illustration of the area pattern shown in FIG. 1, area feature AF2 is also configured as a square, having an edge length of two units (i.e. $X_{L2}=2$, $Y_{L2}=2$). No additional area features are located in area window AW1.

Proceeding to the second area window AW2, it can be seen that portions of three area features are located within the second window. Specifically, each of area features AF1 and AF2 overlaps the first and second area windows AW1 and AW2 and a third area feature AF3 is located entirely within area window AW2. In the course of the examination of area window AW2 for the presence of area features, and the storage of information describing the geometry of such located area features within area window AW2 within the heap memory shown in FIG. 2, only information relating to area feature AF3 is stored, as the location (the upper left-hand corner) of an area feature defines its location within an area window. Since the upper left-hand corner of each of area features AF1 and AF2 is located within area window AW1 and only area feature AF3 has its upper left-hand corner (its location) within area window AW2 ($X_3=8$, $Y_3=8$), only area feature AF3 is identified as being present in area window 2. Area feature 3 is also shown as a square, two units on a side, so that $X_{L3}=2$, $Y_{L2}=8$. No other area features are located within area window AW2.

Proceeding next to area window AW3, a rectangularly shaped area feature AF4 having a width of five units and a vertical length of three units is located at coordinates ($X_4=13$, $Y_4=12$). No other area features are located within area window AW3. Thus, within the heap memory table of FIG. 2, only area feature AF4 is designated as being located within area window AW3.

Finally, within area window AW4, which extends down the pattern from distance increment DI-4 (between distance units 15 and 19.99 . . . ), an area feature AF5, shown as a square, three units on an edge side, and located (upper left-hand corner) at coordinates $X_5=17$, $Y_5=21$ is found. Again, although area feature AF4 extends into area window AW4, it is not identified as being located within area window AW4, since the upper left-hand corner ($X_4=13$, $Y_4=12$) of area feature AF4 is located within area window AW3. Thus, within the heap memory shown in FIG. 2, area feature AF5 is stored in a memory file associated with area window AW4.

As pointed out above, proximity correction of an area feature based upon neighboring area features in a lithography process is necessary where adjacent area features are sufficiently close to cause a cross-dosage of the beams through which the area features are formed. Simply put, the cross-dosing problem exists only for neighboring features, not for remote features. However, it has been conventional practice to evaluate whether or not every feature within a pattern is close enough to a feature of interest to warrant a proximity correction of the dosage based upon that feature. Such an evaluation of effectively non-neighboring area features adds considerable complexity and computational intensity to th proximity correction process.

In accordance with the present invention, a boundary window is established around an area feature of interest and area features which lie outside that boundary window are excluded from the proximity correction process. In an actual integrated circuit design, a pattern will contain hundreds of thousands or perhaps millions of area features, each of which may require proximity correction of the beam dosage. By the use of a boundary window process in accordance with the present invention, most of such a large number of area features can be eliminated as 'neighboring' features for a respective area feature of interest the beam dosage of which is to be corrected for the proximity of adjacent area features surrounding it. The mechanism through which the boundary window is generated and stored in the heap memory for each area feature is shown in FIG. 3.

Figure 3:
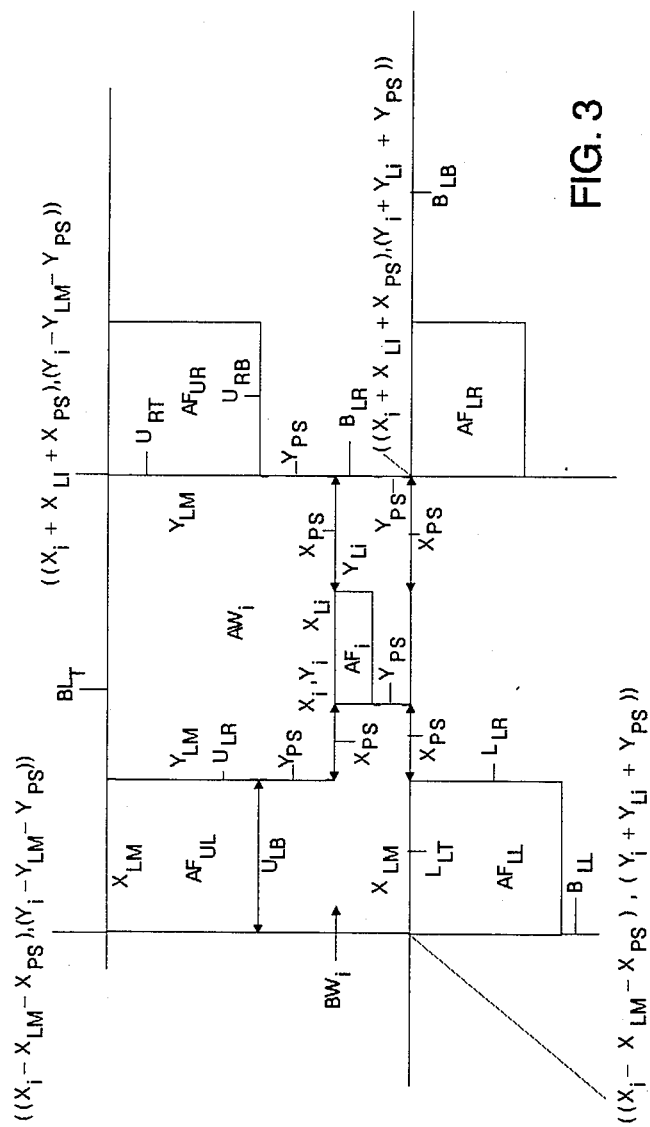
FIG. 3 is a detailed diagrammatic illustration of an individual area feature and its associated boundary window.

More specifically, FIG. 3 shows an exemplary area feature $AF_i$ of interest (located within some area window $AW_i$) at quadrants $X_i$, $Y_i$ and having a length $X_{Li}$ in the X direction and a length $Y_{Li}$ in the vertical or Y direction. As described above, because dosage scattering typically may extend over a range of several microns, any instance where the separation between adjacent area features is less than such a scattering distance will give rise to a proximity correction based upon that separation. In the discussion to follow the extent of this scattering range will be termed predefined spacing between area features, denoted in terms of distance in the horizontal or X-direction (across the pattern) as $X_{ps}$ and the vertical or Y-direction (down the pattern) as $Y_{ps}$.

In addition, each area feature is limited to a preselected maximum size, namely an X dimension $X_{Lm}$ and a Y dimension $Y_{Lm}$. Using these given criteria and the geometrical characteristics of an area feature $AF_i$ of interest, it is possible to readily generate respective pairs of parallel boundary lines the intersections of which form a boundary window around an area feature of interest. Any area feature the location of which falls outside the boundary window is automatically excluded from evaluation in the proximity process for the area feature of interest. As a consequence, it is possible to considerably simplify the proximity correction process.

Referring again to FIG. 3, with the location coordinates of the area feature $AF_i$ being located within area window $AW_i$ at $X_i$, $Y_i$, then in order for another area feature be considered sufficiently close to area feature $AF_i$ to be neighboring, and therefore used for proximity correction, the closest point on that area feature must be spaced from area feature $AF_i$ no greater than the predefined correction spacing distance $X_{ps}$, $Y_{ps}$. Given the location and horizontal or X-dimension of area feature $AF_i$ as $X_i$ and $X_{Li}$, respectively, and predefined correction spacing $X_{ps}$ (in the horizontal or X direction), then a right-hand boundary line $BL_R$ can be defined as extending in the vertical direction and passing through X coordinate ($X_i+X_{Li}+X_{ps}$).

Similarly, in the vertical or Y direction, a lower boundary line $BL_B$ is definable based upon the predefined spacing in the Y direction $Y_{ps}$ and the vertical length $Y_{Li}$ of area feature $AF_i$. The location of boundary line $BL_B$, as measured from the location (coordinates $X_i$, $Y_i$) of area feature $AF_i$ is thus defined by ($Y_i+Y_{Li}+Y_{ps}$), corresponding to a line ($BL_B$) extending in a horizontal direction through this Y coordinate.

Boundary lines $BL_R$ and $BL_B$ form two sides of the boundary window BW surrounding area feature $AF_i$. The remaining sides of the boundary window are defined by an upper boundary line $BL_T$ and a left-hand boundary line $BL_L$. The upper boundary line $BL_T$ depends on the predefined spacing in the vertical or Y direction, ($Y_{ps}$) and the maximum vertical dimension that another area feature of the pattern that is adjacent to the area feature of interest may take. This is shown in FIG. 3 by the vertical dimension $Y_{LM}$ for an area feature $AF_{UL}$, located to the upper-left of area feature $AF_i$, and an area feature $AF_{UR}$, located to the upper right of area feature $AF_i$. Accordingly, boundary line $BL_T$ is a horizontal line (extending in the X direction) passing through Y coordinate $(Y_i-Y_{LM}-Y_{ps})$.

Finally, the fourth or left-hand edge $BL_L$ of the boundary window $BW_i$ is defined similarly to the upper boundary $BL_T$, but with reference to the X or horizontal direction. For predefined spacing $X_{ps}$ and maximum length (in the X or horizontal direction) of an adjacent area feature, a vertical boundary line $BL_L$ passes through X coordinate $(X_i-X_{LM}-X_{ps})$. The intersections of lines $BL_L$, $BL_B$, $BL_R$ and $BL_T$ define the extent of boundary window $BW_i$ and delineate the effective proximity neighborhood or area within which at least a portion of a neighboring area feature must fall in order for that neighboring feature to participate in the proximity correction of the dosage for area feature $AF_i$.

In FIG. 3, a set of four area features $AF_{UR}$, $AF_{UL}$, $AF_{LL}$ and $AF_{LR}$ represent the extremities of the area features that may surround area feature $AF_i$ and have an edge lying along one of the boundary lines $BL_R$, $BL_T$, $BL_L$ and $BL_B$. As a consequence, these area features would be considered as 'neighboring' area features, and would participate in the dosage adjustment for the formation of area feature $AF_i$ in the photolithography process. Any area feature that falls outside of the boundary window $BW_i$ need not be considered in the proximity correction process.

Pursuant to the present invention, boundary lines $BL_R$ and $BL_L$ are established to delimit which portions of the area window data within the heap memory can be excluded.

Figure 4:
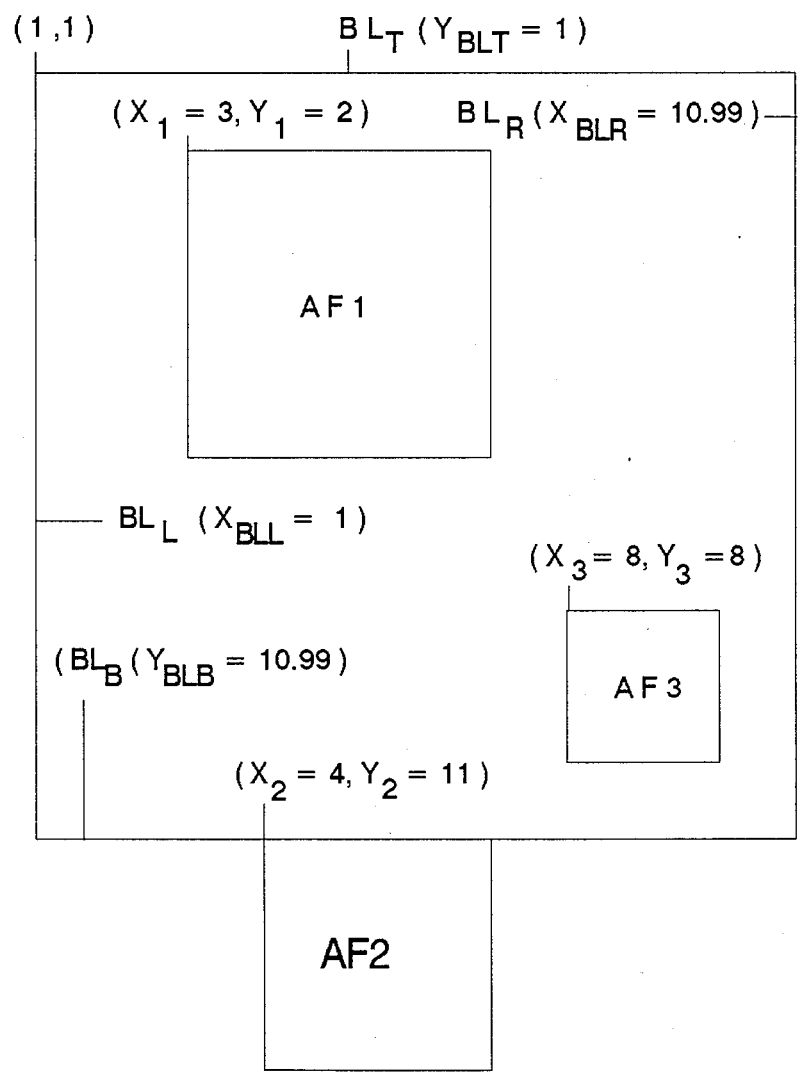
FIG. 4 shows an enlarged portion of the diagrammatic illustration of the area feature pattern of FIG. 1.

Looking, for example, at area feature AF3 in the enlarged portion of the pattern diagram of FIG. 1, shown in FIG. 4, a boundary window BW3 is shown as having sides which encompass area features AF1 and AR3 but exclude area features AF2, AF4 and AF5. In the present example, the predefined spacing $(X_{ps}, Y_{ps})$ is assumed to be one unit (e.g. 3 microns), and the maximum dimension of a side of an area feature is assumed to be six units. Thus, with area features AF3 being the area feature of interest (located at $X_3=8$, $Y_3=8$), the boundary lines of its associated boundary window BW3 are: $BL_{R3}$ $(X_{BLR}=10.99 \ldots)$, $BL_{T3}$ $(X_{BLT}=1)$, $BL_{L3}$ $(X_{BLL}=1)$ and $BL_{B3}$ $(Y_{BLB}=10.99)$. Since area feature AF1 is the only area feature any portion of which falls within boundary window BW3, only area feature AF1 will participate in the proximity correction of the election beam dosage used to write area feature AF3.

Figure 5:
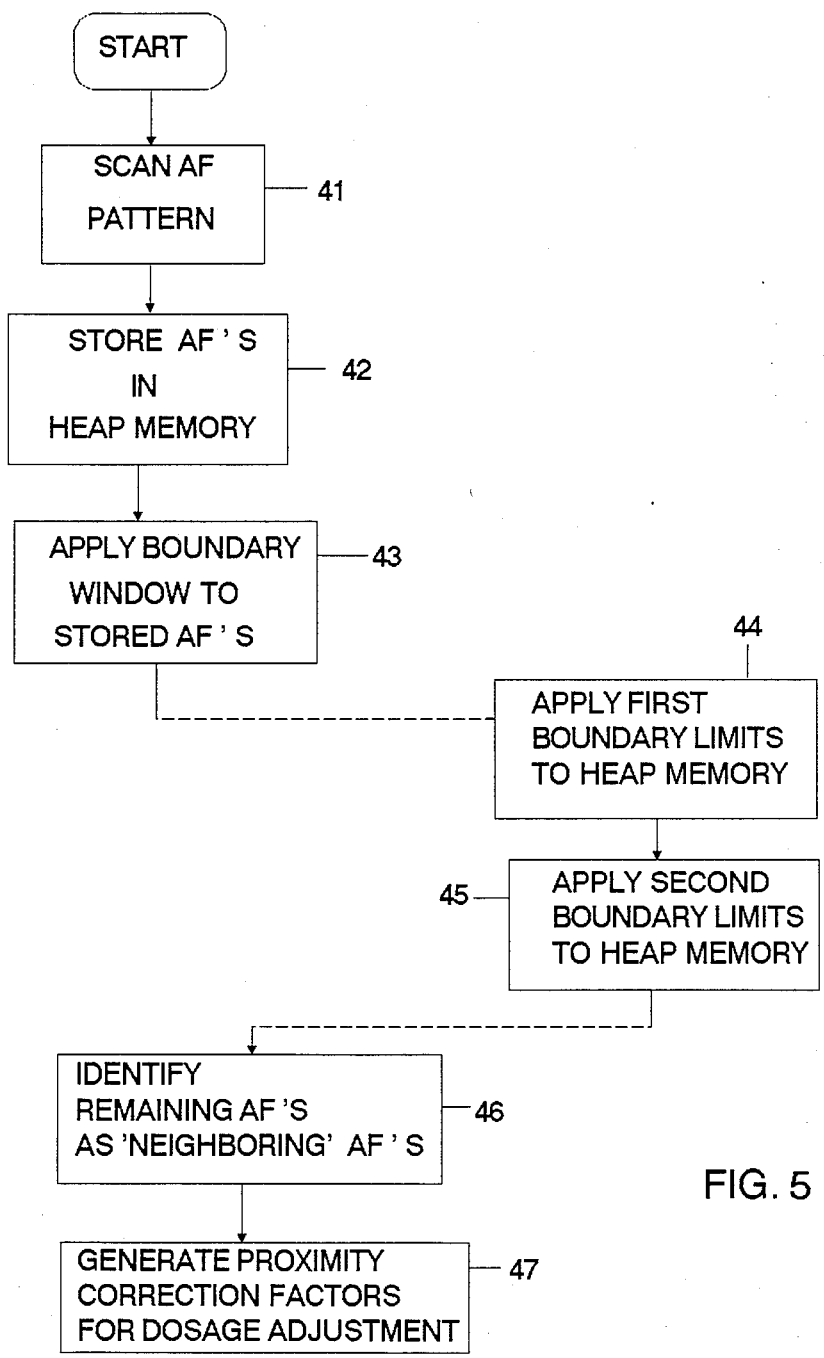
FIG. 5 is a flow diagram of the area feature sorting mechanism of FIGS. 1-4 employed in an electron beam lithography proximity correction process.

FIG. 5 is a flow diagram of the area feature shorting mechanism described above with reference to FIG. 3. Initially, as discussed in connection with the description of FIGS. 1 and 2, the pattern of area features is scanned (step 41) from area window to area window, so that geometry data for the various area features may be generated. When an area feature is located, geometry data (its location, size and boundary window based upon its location, size, maximum feature dimensions and predefined spacing, described above with reference to FIG. 3) is stored in a heap memory file (step 42) associated with the area window in which the area feature is located. As a result, the heap memory table shown in FIG. 2 is generated.

Then, for each respective area of feature within the pattern, it associated boundary window $BW_i$ is applied as a mask (step 43) to the contents of the heap memory, so as to exclude area features that are effectively remote from the area feature of interest and thereby not a factor in the proximity correction process. The boundary window generation procedure is effectively a two-step process, beginning, at step 44, with the generation of a pair of boundary lines $BL_R$ and $B_{LL}$ which, in the heap memory diagram of FIG. 2, may be considered to effectively traverse a pair of area windows (as shown by broken lines 51 and 52) and thereby limit which portions of the heap memory must be accessed. Then, at step 45, the upper and lower boundary lines $BL_T$ and $BL_B$, respectively, of the boundary window are applied to the contents of the heap memory encompassed within the first set of boundary lines in ($BL_R$, $BL_L$).

Those area features which are not excluded by the boundary window generated in steps 44 and 45 are identified in step 46 as participants in the proximity correction process. Namely, the nonexcluded contents of the heap memory are accessed and applied to a subsequent step 47 through which the proximity correction factors for the area feature of interest are generated.

As the details of the proximity correction process itself are not necessary for an understanding of the present invention they will not be described here. However, for purposes of providing an illustrative example, a correction process such as that described in an article entitled "Proximity Effect Correction in Electron-beam Lithography" by T. Kato et al, J. Vac. Sci. Technol. 19(4), Nov/Dec 1981, pp 1279–1285, may be employed.

As will be appreciated from the foregoing description, the complexity and computational intensity of conventional pattern search mechanisms employed for lithography applications are obviated in accordance with the present invention by a new and improved pattern analysis sorting mechanism through which only those area features of a multi-element, two-dimensional array that are proximally 'neighboring' to an area feature of interest may be identified and located, so as to facilitate correction of the dosage for that area feature of an integrated circuit.

While I have shown and described an embodiment in accordance with the present invention, it is to be understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. For use with proximity correction of dosage in lithography processing of a pattern of area features to form an integrated circuit device, a method of locating those area features which lie within a prescribed proximity correction neighborhood of a respective area feature, comprising the steps of:

(a) for each of a plurality of distance increments extending in a first direction across said pattern, examining said pattern to identify those area features which are located within a respective area window extending in a second direction from a respective distance increment, and generating and storing information representative of characteristics of each identified area feature in a group that is associated with that respective area window;

(b) for each of the area features whose identities have been stored in respective groups in step (a), defining a boundary window which delineates said prescribed proximity correction neighborhood relative to that respective area feature; and (c) for a respective area feature, identifying those area features that have been stored in step (a) and characteristics of which are contained within the boundary window for said respective area feature as lying within said prescribed proximity correction neighborhood of said respective area feature.

2. A method according to claim 1, wherein said characteristics correspond to the location and size of said area features.

3. A method according to claim 2, wherein said area features include rectangular shaped features.

4. A method according to claim 1, wherein said boundary window has a first boundary line which extends in said first direction a distance to one side of the location of the respective area feature corresponding to the sum of the maximum possible dimension of the respective area feature in the second direction and a predefined distance between adjacent area features, and a second boundary line, parallel with said first boundary line, which extends in said first direction a distance to a second side of the location of the respective area feature corresponding to the sum of the length of the area feature in the second direction and said predefined separation distance.

5. A method according to claim 4, wherein said boundary window has a third boundary line which extends in said second direction to a first side of the location of the respective area feature of interest a distance corresponding to the sum of the dimension of the respective area feature in the first direction and said predefined separation distance, and a fourth boundary line which extends in said second direction a distance to a second side of the location of the respective area feature corresponding to the sum of the maximum possible dimension of the area feature in the first direction and said predefined separation distance.

6. For use with a pattern of area features, a method of locating those area features which lie within a prescribed neighborhood of a respective area feature, comprising the steps of:

(a) for each of a plurality of distance increments extending in a first direction across said pattern, examining said pattern to identify those area features which are located within a respective area window extending in a second direction from a respective distance increment, and generating and storing information representative of characteristics of each identified area feature in a group that is associated with that respective area window;

(b) for each of the area features whose identities have been stored in respective groups in step (a), defining a boundary window which delineates said prescribed neighborhood relative to that respective area feature; and (c) for a respective area feature, identifying those area features that have been stored in step (a) and characteristics of which are contained within the boundary window for said respective area feature as lying within said prescribed neighborhood of said respective area feature.

7. A method according to claim 6, wherein said boundary window has a first boundary line which extends in said first direction a distance to one side of the location of the respective area feature corresponding to the sum of the maximum possible dimension of the respective area feature in the second direction and a predefined distance between adjacent area features, and a second boundary line, parallel with said first boundary line, which extends in said first direction a distance to a second side of the location of the respective area feature corresponding to the sum of the length of the area feature in the second direction and said predefined separation distance.

8. A method according to claim 7, wherein said boundary window has a third boundary line which extends in said second direction to a first side of the location of the respective area feature of interest a distance corresponding to the sum of the dimension of the respective area feature in the first direction and said predefined separation distance, and a fourth boundary line which extends in said second direction a distance to a second side of the location of the respective area feature corresponding to the sum of the maximum possible dimension of the area feature in the first direction and said predefined separation distance.

9. A method according to claim 6, wherein said characteristics correspond to the location and size of said area features.

10. A method according to claim 9, wherein said area features include rectangular shaped features.

11. For use with proximity correction of dosage in lithography processing of a pattern of area features, the sizes and locations of which within said pattern are representable by first data, onto an integrated circuit device, a method of locating those area features which lie within a prescribed proximity correction neighborhood of a respective area feature, comprising the steps of:

(a) for each of successive distance increments extending in a first direction across said pattern, storing second data identifying those area features first data for which are representative of their locations lying within a respective area window extending from a respective distance increment in a second direction across said pattern;

(b) for a respective area feature second data for which has been stored in step (a), defining a boundary window a first dimension of which extends in said first direction a distance to a first side of the location of said respective area feature corresponding to the sum of the maximum possible dimension of said respective area feature in said first direction and a predefined separation distance between adjacent area features, and which extends in said first direction a distance to a second side of the location of said respective area feature corresponding to the sum of the length of the area feature in the first direction and said predefined separation distance.

(c) for a respective area feature that lies within the dimension of the boundary window defined in step (b), identifying each remaining area feature within said dimension on a first side of the location of said respective area feature the distance between the location of which and the location of said respective area feature in a second direction is less than or equal to the sum of the dimension of said respective area feature in said second direction and said predefined separation distance between adjacent area features, and each remaining area feature within said dimension of said boundary window on a second side of the location of said respective area feature the distance between the location of which and the location of said respective area feature in said second direction is less than or equal to the sum of the maximum dimension of an area feature in said second direction and said predefined separation distance.

* * * * *

UNITED STATES PATENT AND TRADEMARK OFFICE
CERTIFICATE OF CORRECTION

PATENT NO. : 4,812,962

DATED : March 14, 1989

INVENTOR(S) : Terence R. Witt

It is certified that error appears in the above—identified patent and that said Letters Patent is hereby corrected as shown below:

In the Specification, Column 1, between lines 5 and 7, the following paragraph should be inserted.

--The United States Government has rights in the present patent under U.S. Government Contract No. F33615-84-C-1500.--

Signed and Sealed this

Twenty-third Day of January, 1990

Attest:

JEFFREY M. SAMUELS

Attesting Officer     Acting Commissioner of Patents and Trademarks